United States Patent
Shibue et al.

(10) Patent No.: US 8,218,287 B2
(45) Date of Patent: Jul. 10, 2012

(54) THIN-FILM DEVICE

(75) Inventors: Akira Shibue, Tokyo (JP); Yoshihiko Yano, Tokyo (JP); Hitoshi Saita, Tokyo (JP); Kenji Horino, Tokyo (JP)

(73) Assignee: TDK Corporation, Tokyo (JP)

( * ) Notice: Subject to any disclaimer, the term of this patent is extended or adjusted under 35 U.S.C. 154(b) by 190 days.

(21) Appl. No.: 12/727,549

(22) Filed: Mar. 19, 2010

(65) Prior Publication Data

US 2010/0246092 A1 Sep. 30, 2010

(30) Foreign Application Priority Data

Mar. 27, 2009 (JP) ............................... P2009-078744

(51) Int. Cl.
*H01G 4/06* (2006.01)
(52) U.S. Cl. ........ 361/313; 361/303; 361/305; 361/311; 361/321.1; 361/306.1
(58) Field of Classification Search .......... 361/311–312, 361/313, 303–305, 321.1, 321.2, 306.1, 306.3
See application file for complete search history.

(56) References Cited

U.S. PATENT DOCUMENTS

| | | | |
|---|---|---|---|
| 6,462,933 B2 | 10/2002 | Takeshima et al. | |
| 7,539,005 B2 | 5/2009 | Uchida et al. | |
| 7,561,406 B2 | 7/2009 | Saita et al. | |
| 7,696,603 B2 * | 4/2010 | Beach | 257/532 |
| 2007/0278627 A1 | 12/2007 | Kakei et al. | |
| 2008/0010798 A1 | 1/2008 | Borland et al. | |

FOREIGN PATENT DOCUMENTS

| | | |
|---|---|---|
| JP | A-56-144523 | 11/1981 |
| JP | A 3-001515 | 1/1991 |
| JP | A-08-78283 | 3/1996 |
| JP | A 8-279669 | 10/1996 |
| JP | A-09-213569 | 8/1997 |
| JP | A-2000-124056 | 4/2000 |
| JP | A-2001-217142 | 8/2001 |
| JP | A-2004-235360 | 8/2004 |
| JP | A-2006-229097 | 8/2006 |
| JP | A-2007-59896 | 3/2007 |
| JP | A-2007-123723 | 5/2007 |
| JP | A-2007-207948 | 8/2007 |
| JP | A-2007-294937 | 11/2007 |
| JP | A 2007-329190 | 12/2007 |
| JP | A-2008-109082 | 5/2008 |

OTHER PUBLICATIONS

Y. Yoneda et al., "CARTS Europe 2006 Proceedings, Preparation and Characterization of Ultra Thin Chip Capacitor," Proceedings of the 20th Annual Passive Components Symposium, Sep. 25-28 2006, pp. 273-280.

* cited by examiner

*Primary Examiner* — Nguyen T Ha
(74) *Attorney, Agent, or Firm* — Oliff & Beridge, PLC

(57) ABSTRACT

A thin-film device comprises a base electrode made of a metal, a first dielectric layer, a first inner electrode, a second dielectric layer, a second inner electrode, and a third dielectric layer. Letting T1 be the thickness of the lowermost first dielectric layer in contact with the base electrode in the plurality of dielectric layers, and Tmin be the thickness of the thinnest dielectric layer in the plurality of dielectric layers excluding the first dielectric layer, T1>Tmin. Making the first dielectric layer thicker than the thinnest, dielectric layer in the other dielectric layers can increase the distance between a metal part projecting from a metal surface because of the surface roughness of the base electrode and the inner electrode mounted on the lowermost dielectric layer, thereby reducing leakage currents.

3 Claims, 5 Drawing Sheets

(A)

(B)

(C)

(D)

THIN-FILM DEVICE

BACKGROUND OF THE INVENTION

1. Field of the Invention

The present invention relates to a thin-film device.

2. Related Background Art

As electronic devices have been reducing their sizes, demands for smaller sizes and higher functions have also been becoming stronger for electronic components used therein. These demands have similarly been placed on devices such as multilayer ceramic capacitors which are passive components. In particular, demands for thinning them have been increasing because of their mode of usage. Therefore; thin-film multilayer capacitors in which dielectric layers and inner electrode layers mounted on base substrates are thinned to several hundred nanometers or less per layer by thin-film technologies have come into use in place of ceramic capacitors which are hard to thin. Various methods for making a thin-film multilayer capacitor have been studied, known examples of which include those disclosed in Japanese Patent Application Laid-Open Nos. 2000-124056 and 2004-235360.

SUMMARY OF THE INVENTION

For responding to demands for thinner thin-film capacitors, studies for using metal foils as base substrates have recently been under way. However, the metal foils have been problematic in that their surface roughness is so high that they may yield a large leakage current. Though the metal foil surfaces have conventionally been subjected to flattening processes in order to ameliorate the surface roughness, the effect of flattening is not uniform but variable from place to place, whereby leakage characteristics of thin-film capacitors made of the processed metal foils may fluctuate.

For solving the problems mentioned above, it is an object of the present invention to provide a thin-film device which reduces leakage currents and fluctuations in leakage currents among such devices.

For achieving the above-mentioned object, one aspect of the present invention provides a thin-film device comprising a base layer made of a metal, a plurality of dielectric layers mounted on the base layer, and an inner electrode disposed between the dielectric layers; wherein $T1>Tmin$, where $T1$ is the thickness of the lowermost dielectric layer in contact with the base layer in the plurality of dielectric layers, and $Tmin$ is the thickness of the thinnest dielectric layer in the plurality of dielectric layers excluding the lowermost dielectric layer.

This structure makes the lowermost dielectric layer thicker than the thinnest dielectric layer in the other dielectric layers and thus can increase the distance between a metal part projecting from a metal surface because of its surface roughness and the inner electrode mounted on the lowermost dielectric layer, thereby reducing leakage currents. Since the thickness of each of the dielectric layers excluding the lowermost dielectric layer can be made smaller than that of the lowermost dielectric layer, the reduction in capacity caused by thickening the dielectric layers in the thin-film device as a whole can be suppressed to a low level. Thickening the lowermost dielectric layer as mentioned above can also reduce fluctuations in occurrences of leakage currents caused by uneven effects of flattening the metal surfaces.

Preferably, in the thin-film device, $T1 \geq Tmin+Ra$, where $Ra$ is the arithmetic mean roughness of an interface between the base layer and the lowermost dielectric layer. Thus further making the lowermost dielectric layer thicker by the arithmetic mean roughness $Ra$ of the metal surface than the thinnest dielectric layer in the dielectric layers excluding the lowermost layer allows the dielectric layers excluding the lowermost layer to become very thin and fully reduce leakage currents, thereby making it possible to yield a high-capacity thin-film device having reduced leakage currents.

More preferably, $T1>Tmax$, where $Tmax$ is the thickness of the thickest dielectric layer in the plurality of dielectric layers excluding the lowermost dielectric layer.

This structure further increases the thickness of the lowermost dielectric layer, thereby making it possible to yield a thin-film device having further reduced leakage currents.

Preferably, in the thin-film device, $T1 \geq Tmax+Ra$, where $Ra$ is the arithmetic mean roughness of an interface between the base layer and the lowermost dielectric layer. Thus further making the lowermost dielectric layer thicker by the arithmetic mean roughness $Ra$ of the metal surface than the thickest dielectric layer in the dielectric layers excluding the lowermost layer allows the dielectric layers excluding the lowermost layer to become very thin and fully reduce leakage currents, thereby making it possible to yield a high-capacity thin-film device having reduced leakage currents.

The thin-film device may be embodied such that $T1 \leq Tmax$, where $Tmax$ is the thickness of the thickest dielectric layer in the plurality of dielectric layers excluding the lowermost dielectric layer. Such a structure can reduce leakage currents while inhibiting the thin-film device from lowering its capacity.

The thin-film device may also be embodied such that $T1 \leq Tmax+Ra$, where $Ra$ is the arithmetic mean roughness of an interface between the base layer and the lowermost dielectric layer. This permits fluctuations in occurrences of leakage currents caused by uneven effects of flattening the metal surfaces and can reduce the leakage currents while inhibiting the thin-film device from lowering its capacity.

The thin-film device exhibits the foregoing advantageous effects more effectively when the lowermost dielectric layer is formed by a solution technique. When formed by the solution technique, the lowermost dielectric layer can attain an upper face (i.e., a surface different from the interface with the base layer) having reduced influences from the form of the metal surface of the base layer. Therefore, the upper inner electrodes and dielectric layers can be formed without being influenced by the surface roughness of the metal in the base layer, whereby a thin-film device with less leakage currents can be obtained.

The present invention provides a thin-film device which reduces leakage currents and fluctuations in leakage currents among such devices.

DESCRIPTION OF THE PREFERRED EMBODIMENTS

In the following, best modes for carrying out the present invention will be explained in detail with reference to the accompanying drawings. In the explanation of the drawings, the same or similar constituents will be referred to with the same signs while omitting their overlapping descriptions.

Thin-Film Capacitor

Figure 1:
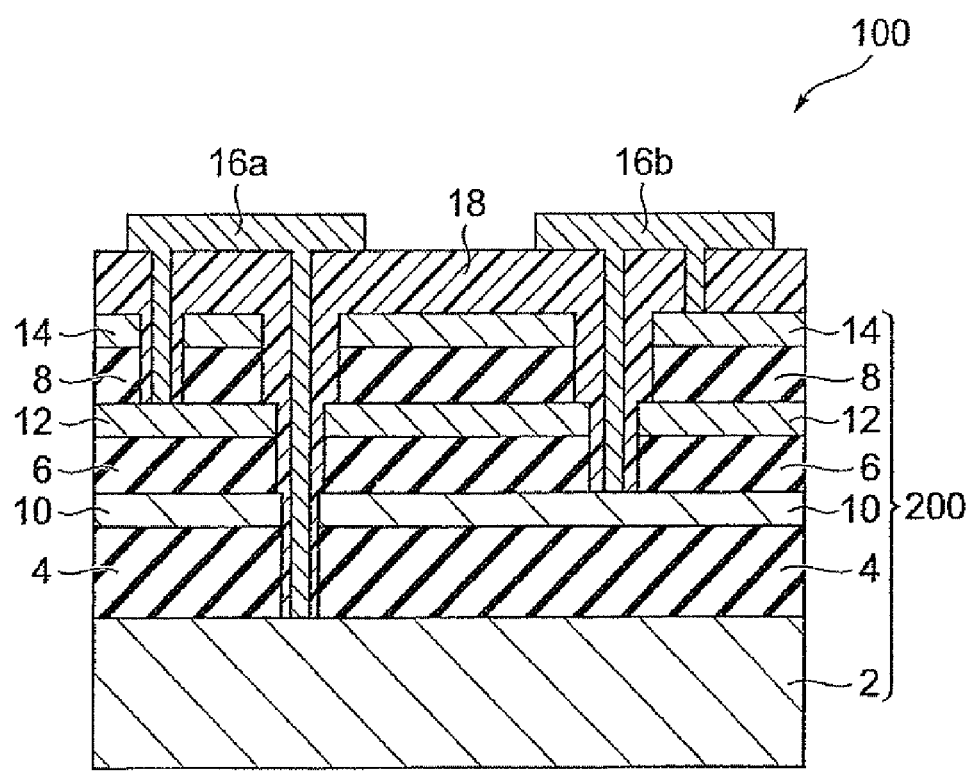
FIG. 1 is a sectional view of a thin-film capacitor 100 which is a thin-film device in accordance with a preferred embodiment of the present invention.

FIG. 1 is a sectional view of a thin-film capacitor 100 which is a thin-film device in accordance with a preferred embodiment of the present invention. As illustrated in FIG. 1, the thin-film capacitor 100 is equipped with a multilayer body 200 constituted by a base electrode (base layer) 2, a first dielectric layer 4 which is the lowermost dielectric layer mounted on and in contact with the base electrode 2, a first inner electrode 10 mounted on the first dielectric layer 4, a second dielectric layer 6 mounted on the first inner electrode 10, a second inner electrode 12 mounted on the second dielectric layer 6, a third dielectric layer 8 mounted on the second inner electrode 12, and an upper electrode 14 mounted on the third dielectric layer 8. That is, the thin-film capacitor 100 comprises the base electrode 2, the three dielectric layers 4, 6, 8 mounted on the base electrode 2, the inner electrodes 10, 12 alternately laminated with the first, second, and third dielectric layers 4, 6, 8, and the upper electrode 14 disposed on the side opposite from the base electrode 2 interposing the dielectric layers 4, 6, 8 and inner electrodes 10, 12 therebetween. The first dielectric layer 4 is discontinuous in the cross section of the thin-film capacitor 100 illustrated in FIG. 1 but continuous within a plane perpendicular to the laminating direction. Similarly, each of the second dielectric layer 6, third dielectric layer 8, first inner electrode 10, second inner electrode 12, and upper electrode 14 is continuous within a plane perpendicular to the laminating direction. The direction in which the base electrode 2, first dielectric layer 4, first inner electrode 10, second dielectric layer 6, second inner electrode 12, third dielectric layer 8, and upper electrode 14 are stacked in sequence will be referred to as the "laminating direction" hereinafter.

The thin-film capacitor 100 comprises a pair of terminal electrodes 16a, 16b on the side opposite from the base electrode 2 interposing the first dielectric layer 4, first inner electrode 10, second dielectric layer 6, second inner electrode 12, third dielectric layer 8, and upper electrode 14 therebetween. One terminal electrode 16a of the pair of terminal electrodes 16a, 16b is electrically connected to the base electrode 2 and second inner electrode 12 through vias. The other terminal electrode 16b is electrically connected to the first inner electrode 10 and upper electrode 14 through vias. The terminal electrodes 16a, 16b are electrically insulated from each other.

The thin-film capacitor 100 further comprises an insulating cover layer 18 filling the gap between the multilayer body 200 constructed by the base electrode 2, first dielectric layer 4, first inner electrode 10, second dielectric layer 6, second inner electrode 12, third dielectric layer 8, and upper electrode 14 and the pair of terminal electrodes 16a, 16b.

Individual parts constituting the thin-film capacitor 100 will now be explained. First, the base electrode 2 is preferably constituted by a foil of nickel (Ni) or copper (Cu) or a metal foil mainly composed of one of these metals. Preferably, the base electrode 2 mainly composed of nickel (Ni) further contains at least one species selected from the group consisting of phosphorus (P), platinum (Pt), palladium (Pd), iridium (Ir), rhodium (Rh), ruthenium (Ru), osmium (Os), rhenium (Re), tungsten (W), chromium (Cr), tantalum (Ta), and silver (Ag). Preferably, the base electrode 2 mainly composed of copper (Cu) further contains at least one species selected from the group consisting of platinum (Pt), palladium (Pd), iridium (h), rhodium (Rh), ruthenium (Ru), osmium (Os), rhenium (Re), tungsten (W), chromium (Cr), tantalum (Ta), and silver (Ag).

When the base electrode 2 is a metal foil, its thickness is preferably 5 to 100 µm, more preferably 20 to 70 µm, further preferably about 30 to 50 µm. When too thin, the base electrode 2 is hard to handle during the making of the thin-film capacitor 100. When too thick, the base electrode 2 makes it impossible to produce a thin capacitor and may lower the capacity as the thin-film capacitor. The base electrode 2 has an area of about $1 \times 0.5$ mm$^2$, for example.

Preferably, the first and second inner electrodes 10, 12 contain at least one element selected from the group consisting of platinum (Pt), palladium (Pd), gold (Au), iridium (Ir), copper (Cu), and nickel (Ni). Each of the first and second inner electrodes 10, 12 has a thickness of about 10 to 1000 nm, for example. Each of the first and second inner electrodes 10, 12 has an area of about $0.9 \times 0.4$ mm$^2$, for example.

The upper electrode 14 is made of nickel (Ni); copper (Cu), or a metal mainly composed of one of these metals. Examples of the metal containing Cu include Cu and Cu alloys. Examples of the Cu alloys include. Corson Cu alloys doped with Ni and Si, Cu alloys doped with Cr and Sn, and Cu alloys doped with Ni—Fe series. The upper electrode 14 may contain minute amounts of impurities to such an extent that the advantageous effects of the present invention are not marred thereby. Examples of the impurities that can be contained in the upper electrode 14 include transition metal and rare-earth elements such as iron (Fe), titanium (Ti), copper (Cu), aluminum (Al), magnesium (Mg), manganese (Mn), silicon (Si), chromium (Cr), vanadium (V), zinc (Zn), niobium (Nb), tantalum (Ta), yttrium (Y), lanthanum (La), and cesium (Ce); chlorine (Cl); sulfur (S); and phosphorus (P).

The terminal electrodes 16a, 16b are constituted by an electrically conductive material such as Cu, for example. The cover layer 10 is constructed by an insulating material such as polyimide, for example.

Preferably, the first, second, and third dielectric layers 4, 6, 8 have a perovskite structure expressed by the chemical formula of $ABO_3$, where A contains at least one element of barium (Ba), strontium (Sr), and calcium (Ca), and B contains at least one element of titanium (Ti), zirconium (Zr), and hafnium (Hf). The dielectric layers 4, 6, 8 may contain additive substances as auxiliary components when appropriate in order to regulate their characteristics.

Each of the first, second, and third dielectric layers 4, 6, 8 has a thickness of 10 to 1000 nm, for example. Each of the dielectric layers 4, 6, 8 has an area of about $0.95 \times 0.45$ mm$^2$, for example.

Figure 2:
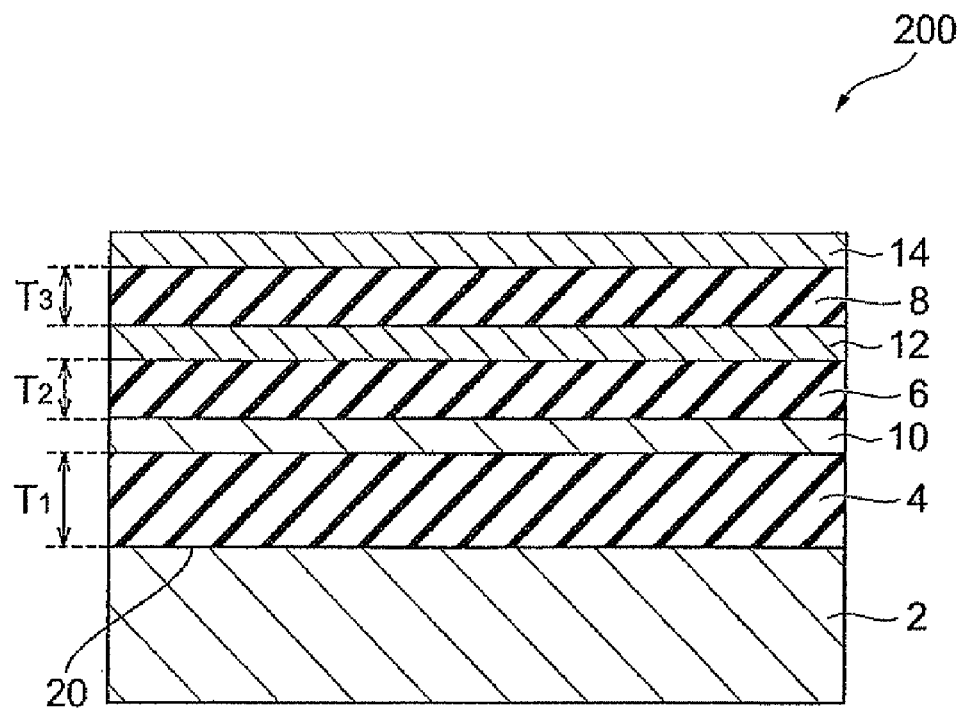
FIG. 2 is a sectional view of a multilayer body 200 constituting the thin-film capacitor 100 in accordance with the embodiment.
Figure 3:
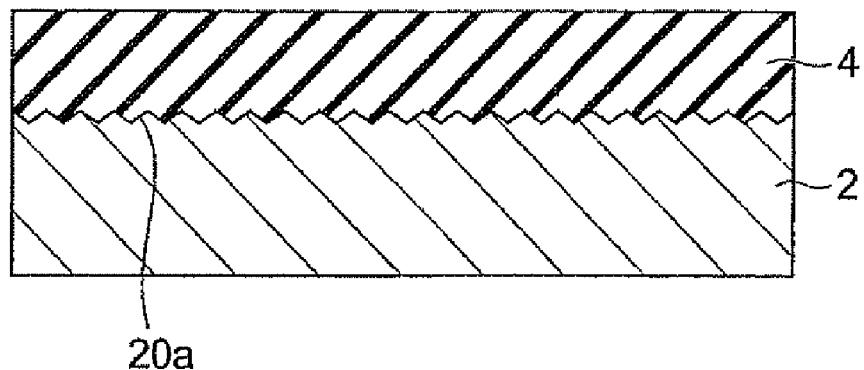
FIG. 3 is a view schematically illustrating a cross section near an interface between a base electrode 2 and a first dielectric layer 4 in the thin-film capacitor 100.
Figure 4:
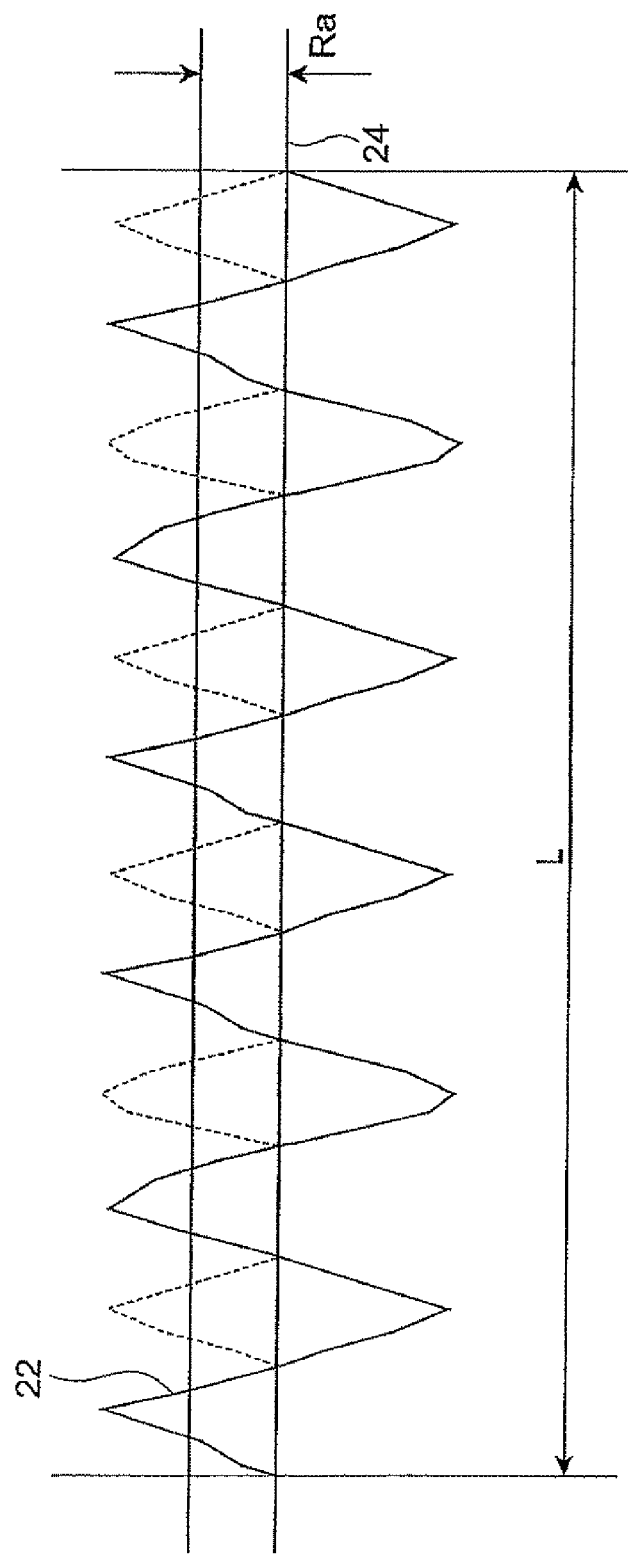
FIG. 4 is a chart explaining the arithmetic mean roughness $Ra$ of the interface.

The thicknesses of the dielectric layers 4, 6, 8 characterizing the present invention will now be explained with reference to FIGS. 2 to 4. FIG. 2 is a sectional view explaining the structure of the multilayer body 200 constituting the thin-film capacitor 100 in accordance with this embodiment. FIG. 3 is a view schematically illustrating a cross section near an interface between the base electrode 2 and first dielectric layer 4 included in the thin-film capacitor 100. FIG. 4 is a chart explaining the arithmetic mean roughness Ra of the interface.

Let T1, T2, and T3 (all expressed by the unit of nm) be the respective thicknesses of the first, second, and third dielectric layers 4, 6, 8 as illustrated in FIG. 2. The thicknesses T1, T2, and T3 in this embodiment refer to respective average values of the thicknesses of the dielectric layers 4, 6, 8 each measured at given 10 points in a cross section of the multilayer body 200. The interface between the base electrode 2 and first dielectric layer 4 will be referred to as an interface 20.

Here, T1>Tmin, where Tmin is the thickness of the thinnest dielectric layer in the thickness T2 of the second dielectric layer 6 and the thickness T3 of the third dielectric layer 8. This can inhibit leakage currents from occurring between the base electrode 2 and first inner electrode 10.

A principle by which leakage currents can be suppressed when the relationship of T1>Tmin is satisfied as mentioned above will now be explained in the multilayer body 200 constituting the thin-film capacitor 100, the interface 20 between the base electrode 2 and first dielectric layer 4 has strong irregularities. This results from the fact that the surface roughness of the metal foil constituting the base electrode 2 is higher than that of a conventionally known silicon substrate or the like. When the first dielectric layer 4 is mounted on the upper face of the base electrode 2 made of the metal foil having such a rough surface, their interface 20 attains a form having irregularities reflecting the surface roughness of the base electrode 2. Therefore, the first dielectric layer 4 may become thinner where it is mounted on parts (projections) of the base electrode 2 which rise in the laminating direction, thereby causing leakage currents. By increasing the thickness T1 of the first dielectric layer 4 as a whole, the thin-film capacitor 100 in accordance with this embodiment can make the first dielectric layer 4 thicker on the upper faces of the projections of the base electrode 2, whereby leakage currents can be inhibited from occurring.

Preferably, in the thin-film capacitor 100 in accordance with this embodiment, the thickness T1 of the first dielectric layer 4 satisfies T1≧Tmin+Ra, where Ra (nm) is the arithmetic mean roughness of the interface between the base electrode 2 and first dielectric layer 4.

The arithmetic mean roughness Ra will now be explained. The arithmetic mean roughness is defined in JIS B 0601. For determining the arithmetic mean roughness, a cross section of the multilayer body 200 is exposed at first. This is done by a method of mechanically polishing the multilayer body 200 buried in a resin, a method of processing a cross section of the multilayer body 200 with a focused ion beam (FIB) or the like, etc. Subsequently, a part including a profile curve in the exposed cross section is observed through a scanning electron microscope or the like, so as to acquire an image of this part. The cross-sectional image acquired here is one in which the form of the interface between the base electrode 2 and first dielectric layer 4 can be seen in detail as in the schematic diagram of FIG. 3. In FIG. 3, 20*a* refers to a profile curve of the interface 20. In FIG. 3, the depicted horizontal length is set to a reference length defined in JIS B 0633, 7.2. 1.

Subsequently, information about the waviness (peaks and troughs) in the profile curve 20*a* of the interface 20 is acquired from the cross-sectional image. Specifically, as defined in HS B 0601, 3. 1. 6., a longer wavelength component is cut off with a high-pass filter, so as to yield a roughness profile. FIG. 4 is a chart illustrating an example of roughness profiles. In FIGS. 4, 22 and 24 refer to a roughness profile and a mean line of the roughness profile 22, respectively.

Thereafter, an arithmetic operation expressed by the following equation (1) is carried out according to the roughness profile corresponding to the interface 20, whereby the arithmetic mean roughness of the interface 20 can be determined.

[Math. 1]

$$Ra = \frac{1}{L}\int_0^L |Z(x)|dx \quad (1)$$

This equation is defined in JIS B 0601, 4. 2. 1. Here, Ra and L represent the arithmetic mean roughness and the reference length, respectively. Z(x) is the ordinate value defined in HS B 0601, 3. 2. 8. and represents the height of the roughness profile at a given horizontal position x. The polarity of Z(x) is such that the lower and upper sides of the mean line are negative and positive, respectively.

Such a structure that the thickness T1 of the first dielectric layer 4 is equal to or greater than the sum of the arithmetic mean roughness Ra of the interface 20 between the base electrode 2 and first dielectric layer 4 measured by the above-mentioned method and the thickness Tmin of the thinnest dielectric layer in the thickness T2 of the second dielectric layer 6 and the thickness T3 of the third dielectric layer 8, i.e., T1≧Tmin+Ra, in the thin-film capacitor 100 in accordance with this embodiment can further inhibit leakage currents from being caused by the first dielectric layer 4 thinning on the upper faces of the parts (projections) of the base electrode 2 rising in the laminating direction.

More preferably, the thin-film capacitor 100 in accordance with this embodiment satisfies the relationship of T1>Tmax, where Tmax is the thickness of the thickest dielectric layer in the thickness T2 of the second dielectric layer 6 and the thickness T3 of the third dielectric layer 8. This can further inhibit leakage currents from occurring between the base electrode 2 and first inner electrode 10. Further, such a structure that the thickness T1 of the first dielectric layer 4 is equal to or greater than the sum of the arithmetic mean roughness Ra of the interface 20 between the base electrode 2 and first dielectric layer 4 measured by the above-mentioned method and the thickness Tmax of the thickest dielectric layer in the thickness T2 of the second dielectric layer 6 and the thickness T3 of the third dielectric layer 8, i.e., T1≧Tmax+Ra, can further inhibit leakage currents from occurring.

On the other hand, making the thickness T1 of the first dielectric layer 4 greater than the thickness Tmax of the thickest dielectric layer as mentioned above increases the thickness of the thin-film capacitor 100 as a whole and is apt to reduce the capacity of the whole thin-film capacitor 100. Therefore, the thickness T1 of the first dielectric layer 4, the thickness Tmax of the thickest dielectric layer in the thickness T2 of the second dielectric layer 6 and the thickness T3 of the third dielectric layer 8, and the arithmetic mean roughness Ra of the interface 20 between the base electrode 2 and first dielectric layer 4 satisfying the relationship of T1≦Tmax+Ra can yield the thin-film capacitor 100 having favorably lowered leakage currents, while inhibiting the capacity from decreasing. This permits occurrences of leakage currents to fluctuate because of uneven effects of flattening the metal surface and can reduce leakage currents while suppressing the decrease in capacity of the thin-film capacitor 100.

The decrease in capacity of the thin-film capacitor 100 can further be lowered when the thickness T1 of the first dielectric layer 4 and the thickness Tmax of the thickest dielectric layer in the thickness T2 of the second dielectric layer 6 and the thickness T3 of the third dielectric layer 8 satisfy the relationship of T1≦Tmax.

By employing the above-mentioned structure, the thin-film capacitor 100 in accordance with this embodiment can suppress fluctuations in the thickness of the first dielectric layer 4 caused by irregularities in the base electrode 2 determined by the arithmetic mean roughness Ra. This yields the thin-film capacitor 100 reducing fluctuations of leakage currents among such capacitors. This is because the thin-film capacitor 100 in accordance with this embodiment inhibits leakage currents from occurring without performing a process for flattening the surface of the base electrode 2 which has conventionally been carried out when using a metal foil as the base electrode 2. The conventional process for flattening the surface of the base electrode 2 has been hard to flatten it uniformly. Therefore, though thin-film capacitors made by laminating dielectric layers and inner electrodes at places where the surface of the base electrode 2 is flattened inhibit leakage currents from occurring, those made by laminating dielectric layers and inner electrodes where flattening is insufficient remarkably generate leakage currents, whereby fluctuations among capacitors are so large that their yield decreases. In contrast, by thickening the first dielectric layer 4, the thin-film capacitor 100 in accordance with this embodiment can inhibit leakage currents from being caused by the irregularities of the surface of the base electrode 2 even when the degree of flattening the surface of the base electrode 2 varies from place to place, thereby making it possible to suppress fluctuations in leakage currents among thin-film capacitors.

Preferably, in the thin-film capacitor 100 of this embodiment, the first dielectric layer 4 is formed by a solution technique. When formed by the solution technique, the first dielectric layer 4 can attain an upper face (i.e., a surface different from the interface with the base layer) having reduced influences from the form of the metal surface of the base electrode 2. This can yield the thin-film capacitor 100 having further reduced influences from the roughness of the metal surface, thereby suppressing leakage currents.

Method of Manufacturing Thin-Film Capacitor 100

Figure 5:
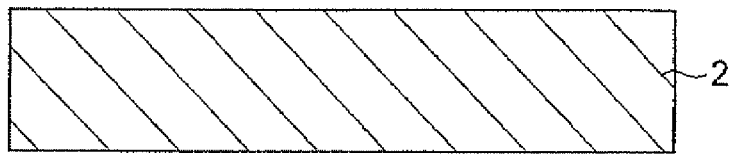
FIG. 5 is a diagram explaining a method of manufacturing the thin-film capacitor 100 of the embodiment.
Figure 5:
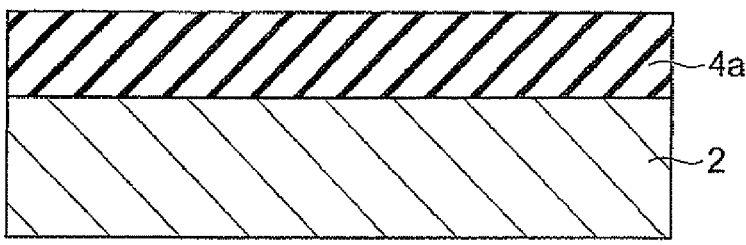
Figure 5:
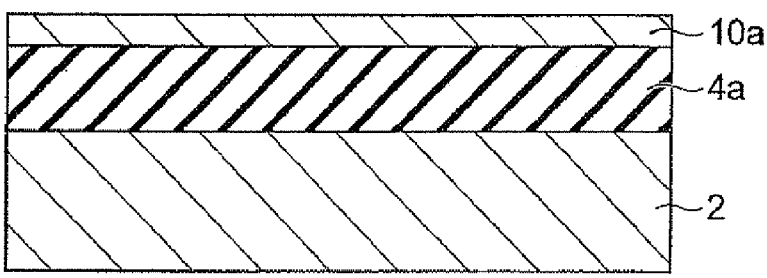
Figure 5:
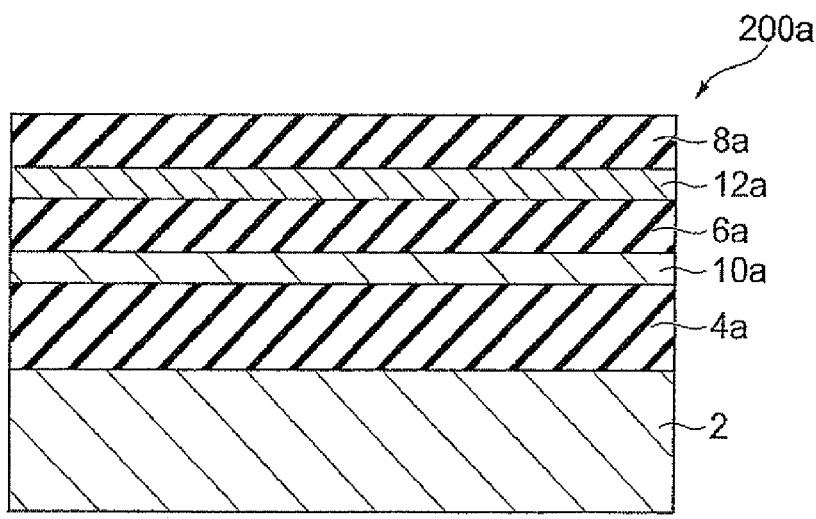

A method of manufacturing the thin-film capacitor 100 of this embodiment will now be explained with reference to FIG. 5. First, as illustrated in FIG. 5(A), the base electrode 2 made of a metal foil is prepared. If necessary, the metal foil is polished such as to attain a surface having a predetermined arithmetic mean roughness Ra. The polishing can be carried out by a method such as CMP (Chemical Mechanical Polishing), electrolytic polishing, or buffing. Subsequently, as illustrated in FIG. 5(B), a dielectric film 4a is formed on the upper face of the base electrode 2. It will be sufficient if the composition of the dielectric film 4a is similar to that of the first dielectric layer 4 in the finished thin-film capacitor 100. Though not only the solution technique but also film-forming techniques such as PVD (Physical Vapor Deposition), e.g., sputtering, and CVD (Chemical Vapor Deposition) can be used, the solution technique is a more favorable method. This is because the dielectric film 4a formed by the solution technique can provide its surface (upper face) with such a form as to be free of influences from the irregularities on the surface of the base electrode 2, whereby the surface (upper face) of the dielectric film 4a can be made flatter. Examples of the solution technique include metal alkoxide methods, coprecipitation, reverse micelle methods, spraying, and sol-gel methods. A plurality of kinds of these methods of forming the dielectric film 4a may be used for forming the dielectric film 4a. For example, the lower part of the dielectric film 4a in contact with the base electrode 2 may be formed by a solution technique, and then the upper part may be formed by sputtering.

The dielectric film 4a is formed thicker than each of dielectric films 6a, 8a which will be explained later. The thickness of the dielectric film 4a can be adjusted by changing conditions under which the dielectric film 4a is formed. For example, when applying a solution to become the dielectric film 4a by spin coating, the thickness can be regulated by the rotating speed, coating time, and the like.

Next, the base electrode 2 having the dielectric layer 4a mounted thereon is fired, so as to crystallize the dielectric film 4a. Preferably, the temperature during firing is a temperature at which the dielectric film 4a is sintered (crystallized), specifically 500 to 1000° C. The firing time may be about 5 min to 2 hr. The atmosphere during firing may be any of oxidizing, reducing, and neutral atmospheres without being restricted in particular, but is preferably at least under such an oxygen partial pressure that the base electrode 2 is not oxidized.

Subsequently, as illustrated in FIG. 5(C), an inner electrode layer 10a is formed on the whole surface of the inner electrode 10a. It will be sufficient, if the composition of the inner electrode layer 10a is similar to that of the first inner electrode 10 in the finished thin-film capacitor 100. An example of the method for forming the inner electrode 10a is DC sputtering.

Next, a dielectric film 6a is formed on the whole surface of the inner electrode 10a. It will be sufficient if the composition of the dielectric film 6a is similar to that of the second dielectric film 6 in the finished thin-film capacitor 100. The dielectric film 6a is formed by a method similar to that of the dielectric film 4a but made thinner than the dielectric film 4a. Further, the multilayer body having the dielectric film 6a mounted thereon is fired, so as to crystallize the dielectric film 6a. Preferably, the firing temperature, firing time, and firing atmosphere are set similar to those of the dielectric film 4a.

Then, an inner electrode layer 12a is formed on the whole surface of the dielectric film 6a. It will be sufficient if the composition of the inner electrode layer 12a is similar to that of the second inner electrode 12 in the finished thin-film capacitor 100. The inner electrode layer 12a is formed by a method similar to that of the inner electrode 10a. A dielectric film 8a is formed on the whole surface of the inner electrode layer 12a. It will be sufficient if the composition of the dielectric film 8a is similar to that of the third dielectric film 8 in the finished thin-film capacitor 100. The dielectric film 8a is formed by a method similar to that of the dielectric film 6a. Further, the multilayer body having the dielectric film 8a mounted thereon is fired as with the dielectric films 4a, 6a, so as to crystallize the dielectric film 8a. The foregoing steps yield a first multilayer body 200a (see FIG. 5(D)) formed by laminating the base electrode 2, dielectric film 4a, inner electrode layer 10a, dielectric film 6a, inner electrode layer 12a, and dielectric film 8a in sequence. Though the manufacturing method in accordance with this embodiment fires each dielectric film upon its formation, the dielectric films 4a, 6a, 8a may be crystallized at once after forming the dielectric film 8a as the last in sequence.

Subsequently, an upper electrode layer (not depicted) is formed on the whole surface of the dielectric film 8a. This yields a second multilayer body formed by laminating the base electrode 2, dielectric film 4a, inner electrode layer 10a, dielectric film 6a, inner electrode layer 12a, inner electrode layer 8a, and upper electrode layer in sequence. An example of the method for forming the upper electrode layer is DC sputtering.

Then, the second multilayer body is annealed. It will be sufficient if the annealing is carried out in an atmosphere at a temperature of 200 to 400° C. having an oxygen partial pressure $PO_2$ of 20 to 100%. The annealing can stabilize electric characteristics.

Next, the upper electrode layer, dielectric film 8a, inner electrode layer 12a, dielectric film 6a, inner electrode layer 10a, and dielectric film 4a are patterned in sequence by wet etching, so as to form the upper electrode 14, third dielectric layer 8, second inner electrode 12, second dielectric layer 6, first inner electrode 10, and first dielectric layer 4, respectively.

After the annealing, a photoresist is applied to the surface of the upper electrode layer, a mask having a pattern corresponding to the upper electrode 14 in the finished thin-film capacitor 100 is formed by photolithography thereafter, and the upper electrode layer 14a is etched with an etchant, so as form the upper electrode 14. After forming the upper electrode 14, the mask covering the surface of the upper electrode 14 is washed away.

Subsequently, a photoresist is applied to the surfaces of the upper electrode 14 and dielectric film 8a, a mask having a pattern corresponding to the third dielectric layer 8 in the finished thin-film capacitor 100 is formed by photolithography thereafter, and the dielectric film 8a is etched with an etchant, so as form the third dielectric layer 8. After forming the third dielectric layer 8, the mask covering the surfaces of the upper electrode 14 and dielectric layer 8 is washed away.

Then, a photoresist is applied to the surfaces of the upper electrode 14, third dielectric layer 8, and inner electrode layer 12a, a mask having a pattern corresponding to the inner electrode 12 in the finished thin-film capacitor 100 is formed by photolithography thereafter, and the inner electrode layer 12a is etched with an etchant, so as form the second inner electrode 12. After forming the inner electrode 12, the mask covering the surfaces of the upper electrode 14, dielectric layer 8, and second inner electrode 12 are washed away.

The foregoing process is repeated for the dielectric film 6a, inner electrode layer 10a, and dielectric film 4a, so as to form the second dielectric layer 6, inner electrode 10, and first dielectric layer 4. After forming the first dielectric layer 4, the cover layer 18 is formed such, as to cover the surfaces of the base electrode 2, first dielectric layer 4, first inner electrode 10, second dielectric layer 6, second inner electrode 12, third dielectric layer 8, and upper electrode 14, while the pair of terminal electrodes 16a, 16b are formed on the upper face of the cover layer 18. One terminal electrode 16a is electrically connected to the base electrode 2 and second inner electrode 12 through vias, while the other terminal electrode 16b is electrically connected to the first inner electrode 10 and upper electrode 14 through vias. This yields the thin-film capacitor 100 illustrated in FIG. 1.

The above-mentioned manufacturing method can yield the thin-film capacitor 100 in which the first dielectric layer 4 is thicker than the thickest of the other dielectric layers 6, 8.

Though a preferred embodiment of the present invention is explained in the foregoing, the present invention can be modified in various ways without being restricted to the above-mentioned embodiment.

For example, while the above-mentioned embodiment explains the present invention in terms of a thin-film capacitor as an example of thin-film devices, the present invention is also applicable to other thin-film devices such as thin-film varistors, thin-film multilayer piezoelectric bodies, and thin-film resistors, for example.

Though the above-mentioned embodiment explains the thin-film capacitor 100 having three dielectric layers 4, 6, 8, the present invention is applicable to thin-film devices in which at least two dielectric layers are mounted on the base electrode (base layer) 2 made of a metal.

EXAMPLES

The present invention will be explained in further detail with reference to examples and comparative examples, but will not be limited to the following examples at all.

Making of Thin-Film Capacitor of Example 1

The thin-film capacitor 100 illustrated in FIG. 1 was made by the following method. First, a surface of an Ni foil employed as a metal foil was polished by CMP, such as to yield a surface roughness (arithmetic mean roughness) Ra of 20 nm.

Using the Ni foil as the base electrode 2, the dielectric film 4a is formed on the polished surface by a solution technique. Specifically, an organic metal oxide salt solution to become the dielectric film 4a was applied onto the Ni foil by spin coating and then dried. The resulting product was heated to 400° C., so as to pyrolyze organic matters, and then to 900° C., so as to be crystallized, whereby the dielectric film 4a was formed. Thereafter, metallic Ni was sputtered, so as to form the inner electrode layer 10a. Further, the dielectric film 6a, inner electrode layer 12a, and dielectric film 8a were sequentially laminated on the Ni layer to become the inner electrode layer 10a. Each of the second and subsequent dielectric films 6a, 8a was made thinner than the first dielectric film 4a. After laminating these layers in sequence, a Cu electrode to become the upper electrode 14 was sputtered thereon. Thereafter, they were patterned by a photolithography process, the cover layer 18 was disposed thereon, and then the terminal electrodes 16a, 16b were formed, so as to yield the thin-film capacitor in accordance with Example 1. In this thin-film capacitor, the thickness T1 of the first dielectric layer 4 was 110 nm, while the thickness of each of the second dielectric layer 6 and third dielectric layer 8 was 100 nm (i.e., each of Tmin and Tmax was 100 nm). The thickness of each dielectric layer was measured by the following method. That is, after laminating the dielectric layers and upper electrode, a cross section was processed with an FIB, and the processed cross section was observed through a transmission electron microscope. Then, the thickness of each layer was measured at each of given points whose number n=10, and their average value was defined as the thickness.

Making of Thin-Film Capacitors of Examples 2 to 14 and Comparative Examples 1 to 4

The thin-film capacitors of Examples 2 to 14 and Comparative Examples 1 to 4 were obtained as with the thin-film capacitor of Example 1 except that the thicknesses of the first, second, and third dielectric layers 4, 6, 8 were changed to the values listed in Table 1.

Evaluation

The thin-film capacitors in accordance with Examples 2 to 14 and Comparative Examples 1 to 4 were prepared 20 samples each, respective leakage currents generated by the thin-film capacitors in response to a voltage of 2 V applied thereto were measured, and their average value and fluctuation among measured values of leakage currents were determined for each set of the samples. Table 1 lists the results.

TABLE 1

| | Dielectric thickness (nm) | | Leakage current (A/cm$^2$) | Fluctuation σ | Ra (nm) |
|---|---|---|---|---|---|
| | Tmin: 2$^{nd}$ and later layer | T1: 1$^{st}$ layer | | | |
| Comparative Example 1 | 100 | 100 | 1.50E−05 | 1.23E−05 | 10 |
| Example 1 | 100 | 110 | 3.26E−06 | 2.53E−06 | 10 |
| Example 2 | 100 | 130 | 4.67E−07 | 2.85E−07 | 10 |
| Example 3 | 100 | 200 | 4.31E−07 | 2.50E−07 | 10 |
| Comparative Example 2 | 100 | 100 | 2.22E−05 | 2.23E−05 | 30 |
| Example 4 | 100 | 120 | 1.35E−06 | 1.08E−06 | 30 |
| Example 5 | 100 | 140 | 4.87E−07 | 4.20E−07 | 30 |
| Example 6 | 100 | 200 | 4.45E−07 | 2.79E−07 | 30 |
| Comparative Example 3 | 200 | 200 | 4.45E−07 | 3.28E−07 | 30 |
| Example 7 | 200 | 220 | 2.05E−07 | 5.71E−08 | 30 |
| Example 8 | 200 | 230 | 1.11E−07 | 4.03E−08 | 30 |
| Example 9 | 200 | 240 | 7.99E−08 | 4.86E−08 | 30 |
| Example 10 | 200 | 300 | 5.19E−08 | 3.54E−08 | 30 |
| Comparative Example 4 | 300 | 300 | 3.28E−07 | 2.99E−07 | 30 |
| Example 11 | 300 | 320 | 7.38E−08 | 2.26E−08 | 30 |
| Example 12 | 300 | 340 | 4.43E−08 | 2.24E−08 | 30 |
| Example 13 | 300 | 400 | 3.35E−08 | 2.31E−08 | 30 |
| Example 14 | 300 | 500 | 2.88E−08 | 1.49E−08 | 30 |

As Table 1 indicates, when the thin-film capacitors of Comparative Example 1 and Examples 1 to 3 each having an arithmetic mean roughness Ra of 10 nm and a dielectric thickness Tmin of 100 nm were compared with each other, the thin-film capacitors of Examples 1 to 3 in which T1 was greater than Tmin were seen to yield lower leakage currents and fluctuations among the leakage currents than those in the thin-film capacitor of Comparative Example 1 in which T1=Tmin. Similarly, when compared under the condition of the same arithmetic mean roughness Ra and the same dielectric thickness, the thin-film capacitors of Examples 4 to 14 in which T1 was greater than Tmin were seen to yield lower leakage currents and fluctuations among the leakage currents than those in the thin-film capacitors of Comparative Examples 2 to 4 in which T1=Tmin. It was also seen that these effects were obtained more remarkably in Examples 1 to 3, 5, 6, 8 to 10, and 12 to 14 satisfying the relationship of T1≧Tmin+Ra.

Though the above-mentioned examples evaluated thin-film capacitors in which Tmin equaled Tmax (i.e., the second and subsequent layers had the same dielectric thickness), leakage currents and fluctuations among the leakage currents were further reduced when the thickness T1 satisfied the relationship of T1≧Tmax+Ra in the case Where Tmin and Tmax differed from each other (i.e., where the second and subsequent layers did not have the same dielectric thickness).

What is claimed is:

1. A thin-film device comprising:
   a base layer made of a metal;
   a plurality of dielectric layers mounted on the base layer; and
   an inner electrode disposed between the dielectric layers;
   wherein T1>Tmin, where T1 is the thickness of the lowermost dielectric layer in contact with the base layer in the plurality of dielectric layers, and Tmin is the thickness of the thinnest dielectric layer in the plurality of dielectric layers excluding the lowermost dielectric layer, and
   wherein T1>Tmin+Ra, where Ra is the arithmetic mean roughness of an interface between the base layer and the lowermost dielectric layer.

2. A thin-film device comprising:
   a base layer made of a metal;
   a plurality of dielectric layers mounted on the base layer; and
   an inner electrode disposed between the dielectric layers;
   wherein T1>Tmin, where T1 is the thickness of the lowermost dielectric layer in contact with the base layer in the plurality of dielectric layers, and Tmin is the thickness of the thinnest dielectric layer in the plurality of dielectric layers excluding the lowermost dielectric layer,
   wherein T1>Tmax, where Tmax is the thickness of the thickest dielectric layer in the plurality of dielectric layers excluding the lowermost dielectric layer, and
   wherein T1>Tmax+Ra, where Ra is the arithmetic mean roughness of an interface between the base layer and the lowermost dielectric layer.

3. A thin-film device comprising:
   a base layer made of a metal;
   a plurality of dielectric layers mounted on the base layer; and
   an inner electrode disposed between the dielectric layers;
   wherein T1>Tmin, where T1 is the thickness of the lowermost dielectric layer in contact with the base layer in the plurality of dielectric layers, and Tmin is the thickness of the thinnest dielectric layer in the plurality of dielectric layers excluding the lowermost dielectric layer, and
   wherein T1≦Tmax+Ra, where Tmax is the thickness of the thickest dielectric layer in the plurality of dielectric layers excluding the lowermost dielectric layer, and Ra is the arithmetic mean roughness of an interface between the base layer and the lowermost dielectric layer.

* * * * *